(12) United States Patent
He et al.

(10) Patent No.: US 7,718,309 B2
(45) Date of Patent: May 18, 2010

(54) PLATINUM AND TUNGSTEN CONTAINING ELECTROCATALYSTS

(75) Inventors: Ting He, Dublin, OH (US); Eric Rolland Kreidler, Pickerington, OH (US); Tadashi Nomura, Tochigi (JP); Lara Minor, Columbus, OH (US)

(73) Assignee: Honda Motor Co., Ltd., Tokyo (JP)

( * ) Notice: Subject to any disclaimer, the term of this patent is extended or adjusted under 35 U.S.C. 154(b) by 1047 days.

(21) Appl. No.: 11/004,235

(22) Filed: Dec. 6, 2004

(65) Prior Publication Data
US 2006/0121332 A1 Jun. 8, 2006

(51) Int. Cl.
*H01M 4/92* (2006.01)

(52) U.S. Cl. .............. 429/126; 429/40; 429/44; 502/339; 420/466

(58) Field of Classification Search .......... 429/126, 429/40, 44; 502/339; 420/466
See application file for complete search history.

(56) References Cited

U.S. PATENT DOCUMENTS

| | | | |
|---|---|---|---|
| 3,506,494 A | 4/1970 | Adlhart | |
| 3,645,860 A | 2/1972 | Fishman et al. | |
| 3,856,876 A | 12/1974 | Burnett | |
| 4,126,934 A | 11/1978 | Richter et al. | |
| 4,186,110 A | 1/1980 | Jalan et al. | |
| 4,192,907 A | 3/1980 | Jalan et al. | |
| 4,232,097 A | 11/1980 | Shanks et al. | |
| 4,311,569 A | 1/1982 | Dempsey et al. | |
| 4,457,824 A | 7/1984 | Dempsey et al. | |
| 4,513,094 A | 4/1985 | Luczak | |
| 4,528,083 A | 7/1985 | LaConti et al. | |
| 4,705,610 A | 11/1987 | Tenhover et al. | |
| 4,707,229 A | 11/1987 | Dempsey et al. | |
| 4,746,584 A | 5/1988 | Tenhover et al. | |
| 4,781,803 A | 11/1988 | Harris et al. | |
| 4,826,795 A | 5/1989 | Kitson et al. | |
| 4,937,220 A | 6/1990 | Nickols, Jr. | |
| 5,013,618 A | 5/1991 | Luczak | |
| 5,068,161 A | 11/1991 | Keck et al. | |
| 5,298,343 A | 3/1994 | Savadogo et al. | |
| 5,922,488 A | 7/1999 | Marucchi-Soos et al. | |
| 2001/0027160 A1 | 10/2001 | Lee et al. | |
| 2003/0059666 A1* | 3/2003 | Kourtakis | 429/40 |
| 2004/0013601 A1 | 1/2004 | Butz et al. | |
| 2004/0072061 A1 | 4/2004 | Nakano et al. | |
| 2004/0121219 A1 | 6/2004 | Mei et al. | |
| 2005/0037920 A1 | 2/2005 | Devenney et al. | |
| 2005/0101481 A1* | 5/2005 | Ruth et al. | 502/325 |
| 2008/0032885 A1* | 2/2008 | Uchida et al. | 502/101 |

FOREIGN PATENT DOCUMENTS

| | | |
|---|---|---|
| EP | 1 408 569 A2 | 4/2004 |
| GB | 546898 | 8/1942 |
| GB | 2242203 A | 9/1991 |
| WO | WO 99/66574 | 12/1999 |
| WO | WO 03/083963 A2 | 10/2003 |
| WO | WO 2004/109829 A1 | 12/2004 |

* cited by examiner

*Primary Examiner*—Jane Rhee
(74) *Attorney, Agent, or Firm*—Capitol City TechLaw, PLLC; Mark E. Duell

(57) ABSTRACT

The present teachings are directed toward electrocatalyst composition of an alloy of platinum and tungsten for use in fuel cells. The alloy consists essentially of platinum metal present in an atomic percentage ranging between about 20 percent and about 50 percent, and tungsten metal present in an atomic percentage ranging between about 50 percent and about 80 percent.

20 Claims, 2 Drawing Sheets

PLATINUM AND TUNGSTEN CONTAINING ELECTROCATALYSTS

BACKGROUND

1. Field of the Invention

The present teachings relate to electrocatalyst compositions comprising an alloy consisting essentially of platinum and tungsten, with platinum present in an atomic percentage ranging between about 20 percent and about 50 percent.

2. Discussion of the Related Art

The desire to reduce the amount of expensive platinum group metals needed to obtain a desired level of performance for an electrocatalyst is an ever present operational parameter for the design of many operations involving electrocatalysts.

Enhancement of catalyst performance by alloying platinum with various less expensive metals is one of the possible avenues to either reduce the amount of platinum required, or perhaps increase the efficiency of the catalyzed reaction, or both. For instance, the cathode reaction of a typical proton exchange membrane fuel cell ("PEMFC") can utilize an electrode containing a platinum-based catalyst to drive the oxygen reduction reaction.

A need exists for electrocatalyst compositions that reduce the amount of platinum needed to achieve a desired performance level.

SUMMARY

The present teachings satisfy the need for electrocatalyst compositions with lower platinum amounts, particularly for fuel cell electrocatalysts.

The present teachings include an electrocatalyst composition including a metal alloy consisting essentially of platinum and tungsten. The alloy can contain platinum present at an atomic percentage ranging between about 20 percent and about 50 percent, and tungsten present at an atomic percentage ranging between about 50 percent and about 80 percent.

The present teachings also include a fuel cell electrocatalyst comprising a composition consisting essentially of an alloy of platinum metal and tungsten metal. Again, the alloy can contain platinum metal at an atomic percentage ranging between about 20 percent and about 50 percent, and tungsten metal at an atomic percentage ranging between about 50 percent and about 80 percent.

The present teachings further include a fuel cell assembly comprising at least one thin film electrocatalyst, a membrane, and at least one electrode. The thin film electrocatalyst comprises a composition consisting essentially of an alloy of platinum and tungsten metals, with platinum metal present in an atomic percentage ranging between about 20 percent and about 50 percent, and tungsten metal present in an atomic percentage ranging between about 50 percent and about 80 percent.

The present teachings additionally include a fuel cell assembly comprising at least one supported electrocatalyst, a membrane, and at least one electrode. The supported electrocatalyst can comprise a powder composition consisting essentially of an alloy of platinum and tungsten metals supported on a high surface area support material. According to various embodiments of the present teachings, the electrocatalyst can be a supported nanoparticle-containing powder. The alloy can have platinum metal present in an atomic percentage ranging between about 20 percent and about 50 percent, and tungsten metal present in an atomic percentage ranging between about 50 percent and about 80 percent.

BRIEF DESCRIPTION OF THE FIGURES

The accompanying figures, which are included to provide a further understanding of the present teachings and are incorporated in and constitute a part of this specification, illustrate results obtained by various embodiments of the present teachings and together with the detailed description serve to explain the principles of the present teachings. In the figures.

DETAILED DESCRIPTION

Figure 1:
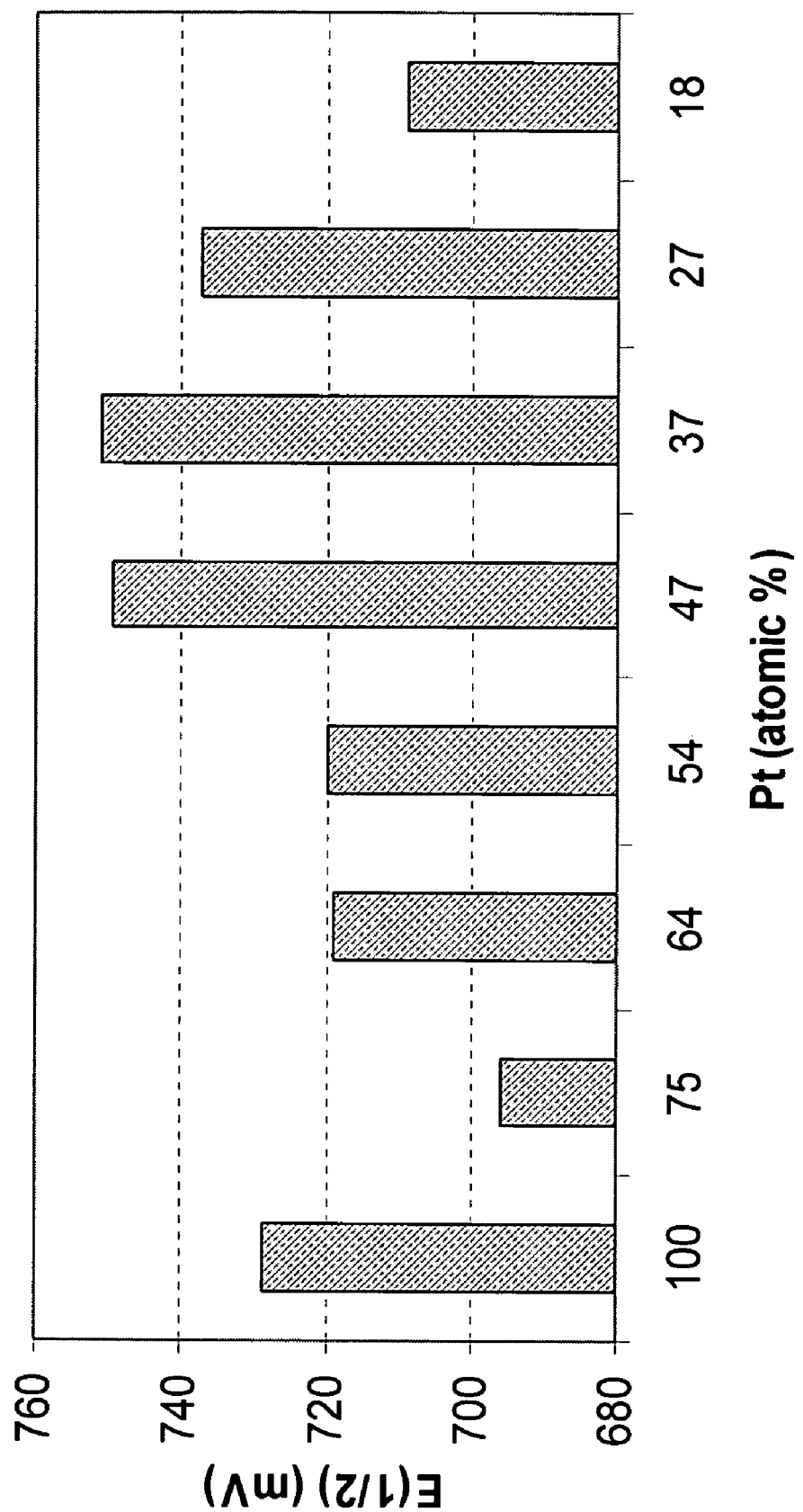
FIG. 1 is a bar graph of the $E_{1/2}$, potential at half current maximum in mV, for the oxygen reduction reaction for platinum and tungsten alloy electrocatalysts at various atomic percentages of platinum.

The present teachings relate to an electrocatalyst composition including a metal alloy consisting essentially of platinum and tungsten. The alloy can contain platinum present at an atomic percentage ranging between about 20 percent and about 50 percent, and tungsten present at an atomic percentage ranging between about 50 percent and about 80 percent.

According to various embodiments of the present teachings, an electrocatalyst composition including a metal alloy consisting essentially of platinum and tungsten is provided. The platinum is present in the alloy at an atomic percentage ranging between about 20 percent and about 50 percent, while the tungsten is present in an atomic percentage ranging between about 50 percent and about 80 percent. According to various embodiments of the present teachings, the tungsten component of the alloy can be partially oxidized. The oxidized tungsten can be present at or on the alloy surface. As used herein, tungsten refers to both oxidized and metallic tungsten located anywhere in a platinum and tungsten-containing alloy according to the present teachings.

According to various embodiments of the present teachings, the electrocatalyst composition alloy can include platinum in an atomic percentage ranging between about 25 percent and about 45 percent, or can include an alloy with platinum present in an atomic percentage ranging between about 30 percent and about 40 percent.

According to various embodiments of the present teachings, the electrocatalyst composition alloy can include tungsten in an atomic percentage ranging between about 55 percent and about 75 percent, or can include an alloy with tungsten present in an atomic percentage ranging between about 60 percent and about 70 percent.

According to various embodiments of the present teachings, also provided is a thin film electrocatalyst composed from an electrocatalyst composition alloy, where the alloy contains essentially platinum present at an atomic percentage ranging between about 20 percent and about 50 percent, and tungsten present at an atomic percentage ranging between about 50 percent and about 80 percent.

According to various embodiments of the present teachings, the electrocatalyst can be a supported nanoparticle-containing powder. The nanoparticles present in the supported powder can range in size from about 0.5 nm to about 100 nm, and can be composed of an alloy of platinum metal and tungsten metal. The alloy can be composed of platinum metal present in an atomic percentage ranging between about 20 percent and about 50 percent, and tungsten metal present in an atomic percentage ranging between about 50 percent and about 80 percent.

According to various embodiments of the present teachings, a fuel cell electrocatalyst is provided. The fuel cell electrocatalyst can include a composition consisting essentially of an alloy of platinum metal and tungsten metal. The alloy can be composed of platinum metal present in an atomic percentage ranging between about 20 percent and about 50 percent, and tungsten metal present in an atomic percentage ranging between about 50 percent and about 80 percent. According to various embodiments of the present teachings, the electrocatalyst can be a thin film, a supported powder, or a supported nanoparticle-containing powder. This thin film fuel cell electrocatalyst can be supported on a support, such as high surface area carbon, or unsupported.

According to various embodiments of the present teachings, the thin film fuel cell electrocatalyst can be prepared by physical vapor deposition. The physical vapor can be plasma generated by a suitable means, for example, plasma guns. Further examples of deposition methods include, for instance, ion plating, ion implantation, evaporation, and laser surface alloying.

According to various embodiments of the present teachings, the thin film fuel cell electrocatalyst can be prepared by co-deposition of the platinum metal and the tungsten metal. Alternatively, the thin film fuel cell electrocatalyst can be prepared by sequential deposition of the platinum metal and the tungsten metal.

According to various embodiments of the present teachings, a fuel cell assembly including a thin film electrocatalyst, a membrane, and an electrode which can be different from the thin film electrocatalyst is provided. According to various embodiments of the present teachings, the thin film electrocatalyst can be composed of a composition consisting essentially of an alloy of platinum and tungsten metals. The alloy can have platinum metal present in an atomic percentage ranging between about 20 percent and about 50 percent, with the tungsten metal present in a corresponding atomic percentage ranging between about 50 percent and about 80 percent.

According to various embodiments of the present teachings, the alloy can include platinum metal present in an atomic percentage ranging between about 25 percent and about 45 percent, or in an atomic percentage ranging between about 30 percent and about 40 percent.

According to various embodiments of the present teachings, the alloy can include tungsten metal present in an atomic percentage ranging between about 55 percent and about 75 percent, or in an atomic percentage ranging between about 60 percent and about 70 percent.

According to various embodiments of the present teachings, the electrocatalyst can be the cathode of a PEMFC and can drive the oxygen reduction reaction of the PEMFC.

According to various embodiments of the present teachings, a thin film can be a film from nanometers to micrometers thick and prepared by physical vapor deposition, electrochemical plating, or ink coating of the desired components onto a suitable substrate. One possible means of producing the desired thin film is physical vapor deposition. Physical vapor deposition refers to the deposition of the components from component vapors generated through, for instance, heat, plasma, and electron beams. The deposition of the components can occur simultaneously, which is referred to as co-deposition, or sequentially. A suitable preparation method is described in pending U.S. patent application Ser. No. 10/757, 302 filed Jan. 14, 2004.

According to various embodiments of the present teachings, a fuel cell assembly including a supported electrocatalyst, a membrane, and at least one electrode which can be different from the supported electrocatalyst is provided. According to various embodiments of the present teachings, the supported electrocatalyst can be composed of a powder composition consisting essentially of an alloy of platinum and tungsten metals, with platinum metal present in an atomic percentage ranging between about 20 percent and about 50 percent, and tungsten metal present in an atomic percentage ranging between about 50 percent and about 80 percent.

According to various embodiments of the present teachings, the powder composition can be prepared by any suitable preparation method, for instance, wet chemical methods. The powder can be supported on a suitable high surface area support. The high surface area support can be, for instance, carbon or alumina. High surface area refers to supports with surface areas of at least about 100 $m^2/g$.

All publications, articles, papers, patents, patent publications, and other references cited herein are hereby incorporated herein in their entireties for all purposes.

Although the foregoing description is directed to the preferred embodiments of the present teachings, it is noted that other variations and modifications will be apparent to those skilled in the art, and which may be made without departing from the spirit or scope of the present teachings.

The following examples are presented to provide a more complete understanding of the present teachings. The specific techniques, conditions, materials, and reported data set forth to illustrate the principles of the present teachings are exemplary and should not be construed as limiting the scope of the present teachings.

EXAMPLES

Thin film samples of varying platinum and tungsten alloy composition were prepared by physical vapor co-deposition of plasma generated metal vapors. A suitable preparation method is described in pending U.S. patent application Ser. No. 10/757,302 filed Jan. 14, 2004.

The activity levels for the oxygen reduction reaction of the platinum and tungsten alloy electrocatalysts were electrochemically screened using a hydrodynamic rotating disc electrode (RDE) apparatus, which is capable of screening numerous material compositions simultaneously. A suitable screening method is described in pending U.S. patent application Ser. No. 10/713,242 filed Nov. 14, 2003.

Figure 2:
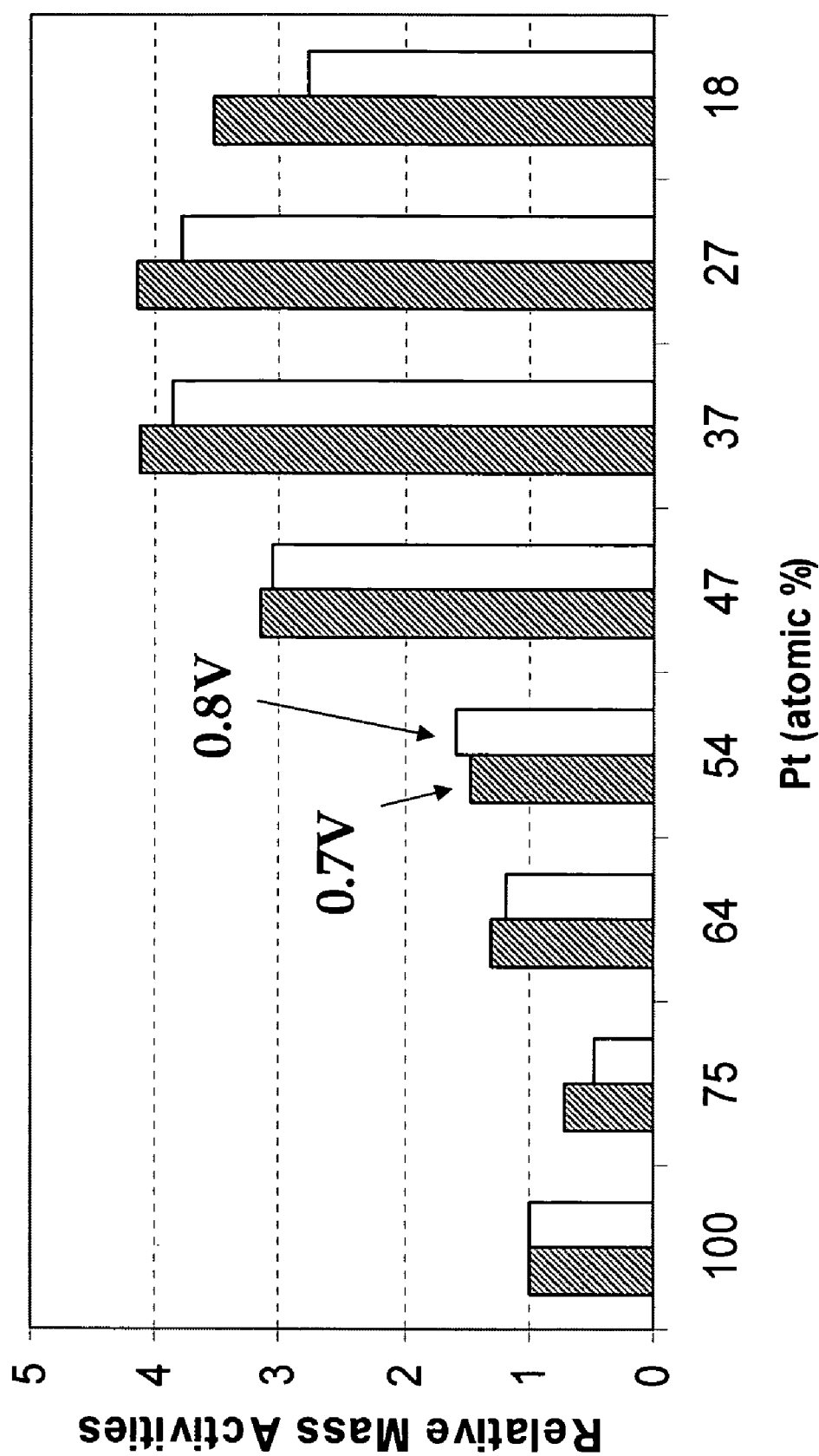
FIG. 2 is a bar graph of the mass-fraction-based activities at 0.7 V and 0.8 V for the oxygen reduction reaction relative to a 100 percent platinum electrocatalyst for platinum and tungsten alloy electrocatalysts at various atomic percentages of platinum.

Thin film samples of alloy were coated onto 5 mm diameter glassy carbon electrodes. Following electrochemical cleaning, the samples were then used as the working electrodes in oxygen reduction reaction cells, and the results are presented in Table 1 and FIGS. 1 and 2.

In Table 1, the atomic percentages of the platinum and tungsten metals are tabulated. The potentials at half current maximum ($E_{1/2}$) in mV, both absolute and relative to pure platinum thin film, are also presented. The absolute potentials at half current maximum ($E_{1/2}$) in mV are presented in FIG. 1. The mass-fraction-based activity (A) relative to pure platinum thin film at both 0.7 V and 0.8 V for each sample is presented in both Table 1 and FIG. 2. The mass-fraction-based kinetic current, $I_k$, in mA/mf Pt at 0.7 V and 0.8 V were calculated from polarization curves and are presented in Table 1.

The results indicate an unexpected performance maxima at a platinum loadings of between about 27 atomic percent and about 47 atomic percent platinum. The alloyed compositions at three tested percentages had unexpectedly higher mass-fraction-based activity levels than an unalloyed pure platinum electrocatalyst.

The foregoing detailed description of the various embodiments of the present teachings has been provided for the purposes of illustration and description. It is not intended to be exhaustive or to limit the present teachings to the precise embodiments disclosed. Many modifications and variations will be apparent to practitioners skilled in this art. The embodiments were chosen and described in order to best explain the principles of the present teachings and their practical application, thereby enabling others skilled in the art to understand the present teachings for various embodiments and with various modifications as are suited to the particular use contemplated. It is intended that the scope of the present teachings be defined by the following claims and their equivalents.

TABLE 1

| Composition | | Relative | | | Absolute | | |
| --- | --- | --- | --- | --- | --- | --- | --- |
| Pt | W | $\Delta E_{1/2}$ (mV) | A (0.7 V) | A (0.8 V) | $E_{1/2}$ (mV) | $I_k$ (0.7 V) | $I_k$ (0.8 V) |
| 1.00 | 0.00 | 0.00 | 1.00 | 1.00 | 728.86 | 1.7540 | 0.2234 |
| 0.75 | 0.25 | −32.96 | 0.71 | 0.47 | 695.90 | 1.2540 | 0.1051 |
| 0.64 | 0.36 | −10.05 | 1.30 | 1.19 | 718.81 | 2.2789 | 0.2659 |
| 0.54 | 0.46 | −9.25 | 1.46 | 1.58 | 719.61 | 2.5593 | 0.3529 |
| 0.47 | 0.53 | 20.60 | 3.15 | 3.07 | 749.46 | 5.5229 | 0.6850 |
| 0.37 | 0.63 | 22.13 | 4.13 | 3.87 | 750.99 | 7.2424 | 0.8651 |
| 0.27 | 0.73 | 8.29 | 4.14 | 3.79 | 737.15 | 7.2604 | 0.8470 |
| 0.18 | 0.82 | −20.21 | 3.53 | 2.76 | 708.65 | 6.1923 | 0.6167 |

What we claim is:

1. An electrocatalyst composition consisting essentially of:
a metal alloy consisting of platinum and tungsten,
wherein platinum is present in an atomic percentage ranging between about 27 percent and about 37 percent, and tungsten is present in an atomic percentage ranging between about 63 percent and about 73 percent,
wherein the metal alloy comprises the catalyst layer of a fuel cell cathode and provides at least a four times higher relative mass activity over a 100 percent Pt electrocatalyst composition.

2. The electrocatalyst composition according to claim 1, wherein the platinum is present in an atomic percentage of about 27 percent.

3. The electrocatalyst composition according to claim 1, wherein the platinum is present in an atomic percentage of about 37 percent.

4. The electrocatalyst composition according to claim 1, wherein the tungsten is present in an atomic percentage of about 63 percent.

5. The electrocatalyst composition according to claim 1, wherein the tungsten is present in an atomic percentage of about 73 percent.

6. A thin film fuel cell cathode consisting of the electrocatalyst composition according to claim 1.

7. A supported nanoparticle-containing powder fuel cell cathode consisting of the electrocatalyst composition of claim 1.

8. A fuel cell electrocatalyst comprising:
a composition consisting of an alloy of platinum metal and tungsten metal,
wherein platinum metal is present in an atomic percentage ranging between about 27 percent and about 37 percent, and tungsten metal is present in an atomic percentage ranging between about 63 percent and about 73 percent,
wherein the fuel cell electrocatalyst comprises the catalyst layer of a fuel cell cathode and provides at least a four times higher relative mass activity over a 100 percent Pt composition.

9. The fuel cell electrocatalyst according to claim 8, wherein the electrocatalyst comprises a thin film.

10. The fuel cell electrocatalyst according to claim 8, wherein the electrocatalyst comprises a nanoparticle-containing powder.

11. The fuel cell electrocatalyst according to claim 10, wherein the nanoparticle-containing powder is unsupported.

12. The fuel cell electrocatalyst according to claim 10, wherein the nanoparticle-containing powder is supported by a high surface area conductive carrier.

13. The fuel cell electrocatalyst according to claim 12, wherein the high surface area conductive carrier comprises carbon black.

14. A fuel cell assembly comprising:
a cathode,
a membrane, and
an anode;
wherein the cathode comprises a catalyst layer consisting of an alloy of platinum and tungsten metals, and wherein the platinum metal is present in an atomic percentage ranging between about 27 percent and about 37 percent, and tungsten metal is present in an atomic percentage ranging between about 63 percent and about 73 percent and provides at least a four times higher relative mass activity over a 100 percent Pt cathode.

15. The fuel cell assembly according to claim 14, wherein the platinum metal is present in an atomic percentage of about 27 percent.

16. The fuel cell assembly according to claim 14, wherein the platinum metal is present in an atomic percentage of about 37 percent.

17. The fuel cell assembly according to claim 14, wherein the tungsten metal is present in an atomic percentage of about 63 percent.

18. The fuel cell assembly according to claim 14, wherein the tungsten metal is present in an atomic percentage of about 73 percent.

19. The fuel cell assembly according to claim 14, wherein the cathode comprises a thin film electrocatalyst.

20. The fuel cell assembly according to claim 14, wherein the cathode comprises a supported nanoparticle-containing powder electrocatalyst.

* * * * *